(12) United States Patent
Downey

(10) Patent No.: US 7,135,423 B2
(45) Date of Patent: Nov. 14, 2006

(54) METHODS FOR FORMING LOW RESISTIVITY, ULTRASHALLOW JUNCTIONS WITH LOW DAMAGE

(75) Inventor: Daniel F. Downey, Magnolia, MA (US)

(73) Assignee: Varian Semiconductor Equipment Associates, Inc, Gloucester, MA (US)

( * ) Notice: Subject to any disclaimer, the term of this patent is extended or adjusted under 35 U.S.C. 154(b) by 0 days.

(21) Appl. No.: 10/142,313

(22) Filed: May 9, 2002

(65) Prior Publication Data
US 2003/0211670 A1    Nov. 13, 2003

(51) Int. Cl.
H01L 21/26  (2006.01)
H01L 21/42  (2006.01)
C23C 16/00  (2006.01)

(52) U.S. Cl. ............... 438/795; 118/725; 257/E21.598
(58) Field of Classification Search ........... 438/795, 438/407; 118/725; 428/514; 252/412
See application file for complete search history.

(56) References Cited

U.S. PATENT DOCUMENTS

| 4,013,485 | A |   | 3/1977  | Ma et al. |
| 4,504,323 | A |   | 3/1985  | Arai et al. |
| 5,225,357 | A |   | 7/1993  | Ho |
| 5,395,780 | A |   | 3/1995  | Hwang |
| 5,504,016 | A |   | 4/1996  | Aronowitz |
| 5,712,181 | A |   | 1/1998  | Byun et al. |
| 5,756,224 | A |   | 5/1998  | Börner et al. |
| 5,956,603 | A |   | 9/1999  | Talwar et al. |
| 5,969,398 | A | * | 10/1999 | Murakami ............ 257/412 |
| 5,972,783 | A |   | 10/1999 | Arai et al. |
| 6,001,715 | A |   | 12/1999 | Manka et al. |
| 6,020,592 | A |   | 2/2000  | Liebert et al. |
| 6,037,640 | A |   | 3/2000  | Lee |
| 6,051,482 | A |   | 4/2000  | Yang |
| 6,069,062 | A | * | 5/2000  | Downey ............ 438/528 |
| 6,180,476 | B1 |  | 1/2001  | Yu |
| 6,182,604 | B1 |  | 2/2001  | Goeckner et al. |
| RE37,158  | E  |  | 5/2001  | Lee |
| 6,335,536 | B1 |  | 1/2002  | Goeckner et al. |
| 6,361,874 | B1 | * | 3/2002  | Yu ................ 428/514 |
| 6,372,591 | B1 |  | 4/2002  | Mineji et al. |
| 6,380,012 | B1 |  | 4/2002  | Chen |
| 6,410,430 | B1 |  | 6/2002  | Lee et al. |
| 2002/0187614 | A1 | * | 12/2002 | Downey ............ 438/407 |

FOREIGN PATENT DOCUMENTS

| EP | 1 096 552 A1 | 5/2001 |
| JP | 02191341 A   | 1/1989 |
| JP | 06089870 A   | 1/1991 |
| JP | 06151348 A   | 11/1992 |

(Continued)

OTHER PUBLICATIONS

Robertson, et al., "Co-implantation of Boron and Fluorine in Silicon" Dec. 2001, Japan Society of Applied Physics, pp. 4-1-1 thru 4-1-5.*

(Continued)

Primary Examiner—W. David Coleman (57) ABSTRACT

Methods for forming ultrashallow junctions in semiconductor wafers include introducing into a shallow surface layer of a semiconductor wafer a dopant material that is selected to form charge carrier complexes which produce at least two charge carriers per complex, and short-time thermal processing of the doped surface layer to form the charge carrier complexes. The short-time thermal processing step may be implemented as flash rapid thermal processing of the doped surface layer, sub-melt laser processing of the doped surface layer, or RF or microwave annealing of the doped surface layer.

25 Claims, 6 Drawing Sheets

FOREIGN PATENT DOCUMENTS

| | | |
|---|---|---|
| WO | WO 99/14799 | 3/1999 |
| WO | WO 01/71787 A1 | 9/2001 |

OTHER PUBLICATIONS

Jining Liu, "Fluorine Effect on Boron Diffusion: Chemical or Damage?", Dec. 1999, IEEE, pp. 951-954.*

Downey, The Role of Extended Defects on the Formation of Ultra-shallow Junctions in Ion Implanted B+, BF2 As+and P+, Dec. 1999, IEEE, pp. 897-901.*

R. Sauer, "Evidence for Bound Multiple-Exciton Complexes in Silicon", Physical Review Letters, Aug. 6, 1973, vol. 31, No. 6, pp. 376-379.*

M. Bayer et al., "Hidden Symmetries in the Energy Levels of Excitonic Artificial Atoms", Nature, vol. 405, Jun. 22, 2000, pp. 923-926.*

D.C. Herbert, "Electron Correlation and Bound Excitons in Semiconductors", J. Phys. C: Solid State Phys., vol. 10, 1977, pp. 3327-3344.*

D.Downey, "Charge Carrier Transport in Single Crystals of $MoS_2$" Ph.D. Thesis, Boston College 1975, published by Xerox Press 1976, Abstract and pp. 138-141.

C.Kittel, "Introduction to Solid State Physics", Third Edition, 1967, pp. 296-305.

Jarosz G. et al., "The Role of Exciton and Charge Carrier Diffusion in Photoenhanced Currents", IEEE Transactions on Dielectrics and Electrical Insulation, vol. 8 No. 3, Jun. 2001, pp. 422-424.

Wolf et al., "Silicon Processing for the VLSI Era", vol. 1, 1986, by Lattice Press, pp. 136-137, 175-182, 303-308 and 325-327.

T.Ito et al., "Flash Lamp Anneal Technology for Effectively Activating Ion Implanted Si", Extended Abstracts of the 2001 International Conference on Solid State Devices and Materials, Tokyo, 2001, pp. 182-183.

R. Knox, "Theory of Excitons", Academic Press, New York (1963).

Ito, T. et al., "10-15 nm Ultrashallow Junction Formation by Flash-Lamp Annealing", Japanese Journal of Applied Physics, Apr. 2002, pp. 2394-2398, vol. 41, No. 4b, XP002259444.

* cited by examiner

Table of "Flash" Anneals data (vs. SPE)

| Wafer # | Implant | PAI | Anneal | Rs | dose | Xj (1E18) | Damage TEM loop density cm$^{-2}$ | Damage TEM Avg loop diameter (Å) | Trapped Interstitials cm$^{-2}$ |
|---|---|---|---|---|---|---|---|---|---|
| AE102 | B$^+$, 500eV, 1E15/cm$^2$ | Ge$^+$, 30keV | SPE, 550C-30min | 850.93 | 4.81E+14 | 167 | 6.00E+11 | 40-60 | 2.00E+14 |
| AA382 | B$^+$, 500eV, 1E15/cm$^2$ | Ge$^+$, 10keV | 1250, flash | 660.3 | 5.27E+14 | 215 | 6.60E+08 | 60-70 | 3.50E+11 |
| AE097 | B$^+$, 500eV, 1E15/cm$^2$ | Ge$^+$, 30keV | 1250, flash | 577.1 | 4.45E+14 | 201 | 5.00E+09 | 50-500 | 2.50E+13 |
| AE238 | B$^+$, 500eV, 1E15/cm$^2$ | no | 1250, flash | 712.1 | 5.92E+14 | 306 | <1.0E+07 | *** | <1.0E+09 |
| AE633 | BF$_2^+$, 500eV, 1E15/cm$^2$ | no | 1250, flash | 2076 | 3.18E+14 | 88 | <1.0E+07 | <30 | <1.0E+09 |
| AE048 | BF$_2^+$, 2.2keV, 2.5E15/cm$^2$ | no | 1250, flash | 508.6 | 9.09E+14 | 178 | <1.0E+07 | <30 | <1.0E+09 |
| AG270 | BF$_3$, 800V, 5E15/cm$^2$ | no | 1250, flash | 754.2 | 8.79E+14 | 172 | <1.0E+07 | <30 | <1.0E+09 |

FIG. 6

METHODS FOR FORMING LOW RESISTIVITY, ULTRASHALLOW JUNCTIONS WITH LOW DAMAGE

FIELD OF THE INVENTION

This invention relates to methods for forming ultrashallow junctions in semiconductor wafers and, more particularly, to methods for forming ultrashallow junctions having low sheet resistance and low damage by the formation and stabilization of charge carrier complexes in a shallow surface layer of the semiconductor wafer.

BACKGROUND OF THE INVENTION

A well-known trend in the semiconductor industry is toward smaller, higher speed devices. In particular, both the lateral dimensions and the depth of features in semiconductor devices are decreasing. State of the art semiconductor devices require junction depths less than 1,000 angstroms and may eventually require junction depths on the order of 200 angstroms or less.

Ion implantation is a standard technique for introducing conductivity-altering dopant materials into semiconductor wafers. In a conventional ion implantation system, known as a beamline ion implanter, a desired dopant material is ionized in an ion source, the ions are accelerated to form an ion beam of prescribed energy, and the ion beam is directed at the surface of the wafer. The energetic ions in the beam penetrate into the bulk of the semiconductor material and are imbedded into the crystalline lattice of the semiconductor material.

Plasma doping systems may be used for forming shallow junctions in semiconductor wafers. In a plasma doping system, a semiconductor wafer is placed on a conductive platen which functions as a cathode. An ionizable gas containing the desired dopant material is introduced into the chamber, and a voltage pulse is applied between the platen and an anode or the chamber walls, causing formation of a plasma having a plasma sheath at the surface of the wafer. The applied voltage causes ions in the plasma to cross the plasma sheath and to be implanted into the wafer. The depth of implantation is related to the voltage applied between the wafer and the anode.

The implanted depth of the dopant material is determined, at least in part, by the energy of the ions implanted into the semiconductor wafer. Shallow junctions are obtained with low implant energies. However, the annealing process that is used for activation of the implanted dopant material causes the dopant material to diffuse from the implanted region of the semiconductor wafer. As a result of such diffusion, junction depths are increased by annealing. To counteract the increase in junction depth produced by annealing, the implant energy may be decreased, so that a desired junction depth after annealing is obtained. This approach provides satisfactory results, except in the case of very shallow junctions. A limit is reached as to the junction depth that can be obtained by decreasing implant energy, due to the diffusion of the dopant material that occurs during annealing. In addition, conventional ion implanters typically operate inefficiently at very low implant energies.

In addition to shallow junction depths, implanted regions are required to have low sheet resistance for proper operation of the devices being fabricated on the semiconductor wafer. The sheet resistance depends in part of the effectiveness of the activation process.

Furthermore, implanted regions are required to have low damage in order to achieve low leakage current devices on the semiconductor wafers. Typically, damage has been removed during the annealing process. However, as noted above, other problems are produced by the annealing process. These factors have presented difficulties in achieving ultrashallow junctions which have low sheet resistance and low damage.

Accordingly, there is a need for methods for fabricating in semiconductor wafers ultrashallow junctions which have low sheet resistance and low damage.

SUMMARY OF THE INVENTION

An aspect of the invention involves the formation and stabilization of charge carrier complexes, such as bound exciton complexes, which are electron-hole pairs bound to dopant and/or other impurities. These exciton complexes can be formed by the introduction of two dopant species which can chemically bond or by the introduction of one dopant species which can chemically bond with the host material or with impurities/defects in the host material. The dopant materials are incorporated in a shallow surface layer, typically 500 angstroms or less, and are chemically bonded together to form complexes about which excitons can form. The excitons form because the coulombic forces of the shallow layers are large and assist in the creation of bound electron-hole pairs (excitons). The bound exciton complexes generally are interstitial and, hence, are not subject to the limitations imposed by the electrical solubility limits resulting from incorporation into substitutional sites. Low sheet resistance can thus be obtained by an increase in dose. The dissociation of the exciton about the complex is the mechanism that provides the free carriers for control of conductivity.

According to a first aspect of the invention, a method is provided for forming an ultrashallow junction in a semiconductor wafer. The method comprises introducing into a shallow surface layer of a semiconductor wafer a dopant material that is selected to form charge carrier complexes which produce at least two charge carriers per complex, and short-time thermal processing of the doped surface layer to form the charge carrier complexes.

The step of short-time thermal processing may comprise flash rapid thermal processing of the doped surface layer. The flash rapid thermal processing step may comprise rapid heating of the substrate to an intermediate temperature and flash heating of the doped surface layer to a final temperature that is higher than the intermediate temperature. In other embodiments, the short-time thermal processing step may comprise sub-melt laser processing of the doped surface layer. In further embodiments, the short-time thermal processing step may comprise RF or microwave annealing of the doped surface layer. The short-time thermal processing step comprises heating the doped surface layer to a desired temperature for a time of about 100 milliseconds or less and preferably comprises heating the doped surface layer to a desired temperature for a time about 10 milliseconds or less.

The dopant material may comprise two species selected to form the charge carrier complexes or may comprise a compound containing two species selected to form the charge carrier complexes. In other embodiments, the dopant material is selected to chemically bond with atoms of the semiconductor wafer to form the charge carrier complexes.

In some embodiments, the dopant material may be introduced into the shallow surface layer by ion implantation. In other embodiments, the dopant material may be introduced into the shallow surface layer by plasma doping.

BRIEF DESCRIPTION OF THE DRAWINGS

For a better understanding of the present invention, reference is made to the accompanying drawings, which are incorporated herein by reference and in which.

DETAILED DESCRIPTION

According to an aspect of the invention, methods are provided for forming ultrashallow junctions in semiconductor wafers. The methods involve the formation of charge carrier complexes which produce at least two charge carriers per complex. Each charge carrier complex includes two or more atoms which are chemically bonded together. Examples include boron bonded to silicon, boron bonded to germanium, and boron bonded to fluorine. The charge carrier complex may include an electron-hole pair bound to the chemically-bonded atoms. At room temperature, the electron-hole pairs are dissociated from the complexes and are available to participate in electrical conduction. An example of a charge carrier complex is the exciton complex described, for example, by R. Knox in *Theory of Excitons*, Academic Press, New York (1963).

The charge carrier complexes may be formed by introducing into a shallow surface layer of the semiconductor wafer two dopant species which can chemically bond or one dopant species which can chemically bond with the host material or with impurities/defects in the host material. Atoms of the dopant species are chemically bonded together to form charge carrier complexes, such as bound exciton complexes. The exciton complexes are typically interstitial and are not subject to the limitations imposed by the electrical solubility limits resulting from incorporation into substitutional sites. The dissociation of the excitons from the complexes provides free charge carriers, which result in low sheet resistance.

Following activation, each charge carrier complex provides two charge carriers, corresponding to the electron-hole pair. By contrast, typical ion implantation processes provide one charge carrier per dopant atom. In practice, a semiconductor wafer may include both charge carrier complexes and conventional substitutional dopant atoms. The practical effect is that more charge carriers are available for conduction as a result of the charge carrier complexes, and sheet resistance is reduced in comparison with conventional conduction mechanisms.

As noted above, the charge carrier complexes can be formed by the introduction into the semiconductor wafer of two dopant species which can chemically bond or by the introduction into the semiconductor wafer of one dopant species which can chemically bond with the host material or with impurities/defects in host material. Examples of dopant materials that may bond to form charge carrier complexes in silicon include, but are not limited to, boron-fluorine (B—F), boron-germanium (B—Ge), boron-silicon (B—Si), phosphorus-fluorine (P—F), phosphorus-germanium (P—Ge), phosphorus-silicon (P—Si), arsenic-fluorine (As—F), arsenic-germanium (As—Ge) and arsenic-silicon (As—Si). Thus, for example, boron-fluorine charge carrier complexes may be formed by the introduction of boron ions and fluorine ions or by the introduction of $BF_2$. Similarly, boron-germanium charge carrier complexes can be formed by the introduction of boron ions and germanium ions. For optimum chemical bonding of the dopant species, the number of atoms of the two dopant species should be approximately equal.

In one embodiment, the dopant material may be introduced into the semiconductor wafer using a beamline ion implanter operating at ultra low energy. In another embodiment, the dopant material may be introduced into the semiconductor wafer using a plasma doping system. In each case, the ion energy is adjusted to implant the dopant material into a shallow surface layer of the semiconductor wafer, typically having a depth of 500 angstroms or less. In another embodiment, the dopant material may be introduced into the semiconductor wafer by gas phase doping. In further embodiments, the dopant material may be introduced into the semiconductor wafer as part of an epitaxial deposition or chemical vapor deposition step. In yet another embodiment, the dopant material may be introduced into the semiconductor wafer by forming alternating mono or atomic layers of dopant material and host material, such as boron and silicon, boron and germanium, or boron, silicon and germanium. The alternating layers may be formed by any of the deposition or implant techniques described above. It will be understood that these techniques for introducing dopant material into the semiconductor wafer are given by way of example only and are not limiting as to the scope of the invention.

Figure 1:
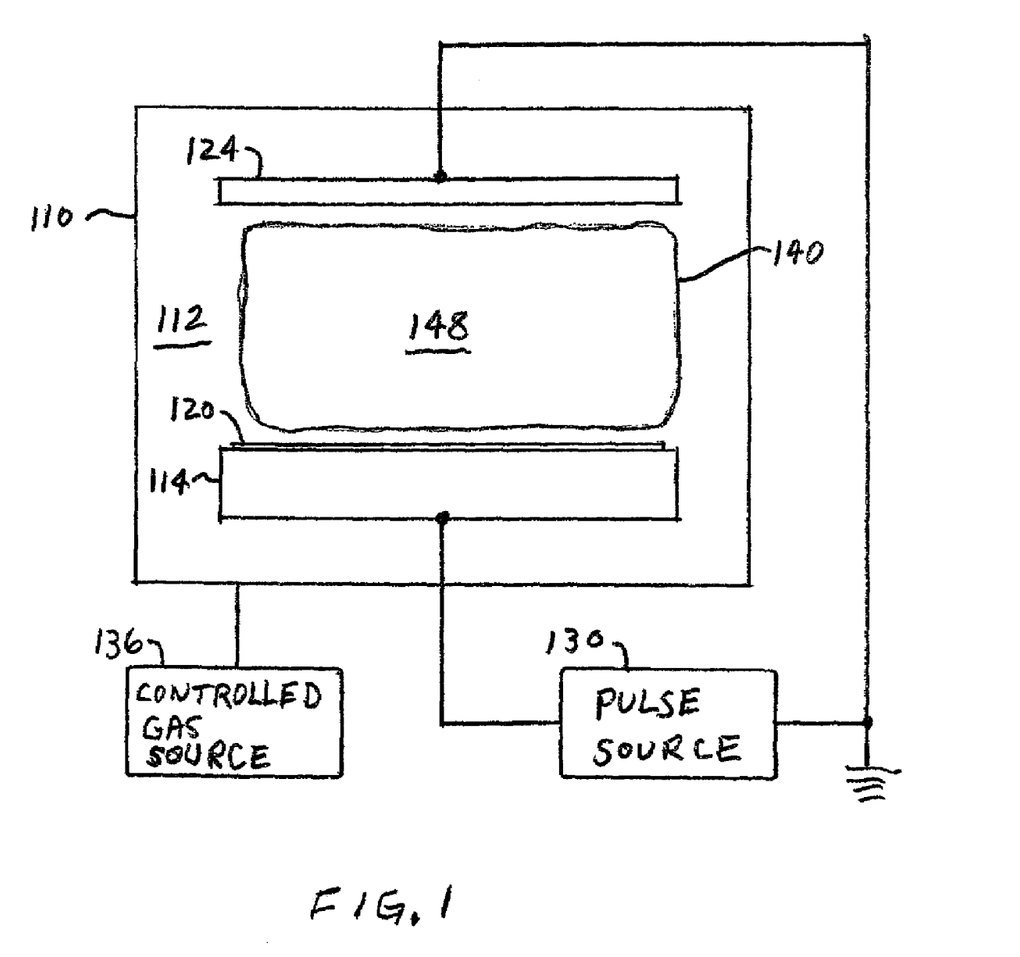
FIG. 1 is a schematic diagram of a plasma doping system.

An example of a plasma doping system suitable for introducing a dopant material into a surface layer of a semiconductor wafer is shown schematically in FIG. 1. A plasma doping chamber 110 defines an enclosed volume 112. A platen 114 positioned within chamber 110 provides a surface for holding a workpiece, such as a semiconductor wafer 120. The wafer is clamped to a flat surface of platen 114, typically by electrostatic clamping. An anode 124 is positioned within chamber 110 in spaced relation to platen 114. The anode is typically connected to electrically conductive walls of chamber 110, both of which may be connected to ground. In another embodiment, platen 114 is connected to ground, and anode 124 is pulsed.

The wafer 120 (via platen 114) and the anode 124 are connected to a pulse source 130, so that the wafer 120 functions as a cathode. The pulse source 130 typically provides pulses in a range of about 100 to 5,000 volts in amplitude, about 1 to 50 microseconds in duration and a pulse repetition rate of about 100 Hz to 2 kHz. It will be understood that these parameters values are given by way of example only and that other values may be utilized.

A controlled gas source 136 is coupled to chamber 110. Gas source 136 supplies an ionizable process gas containing a desired dopant material for implantation into the workpiece. Examples of ionizable process gases include $BF_3$, $N_2$, Ar, $PH_3$, $AsH_3$, and $B_2H_6$. A control system provides a continuous flow of the process gas at a constant gas flow rate and constant pressure. Additional information regarding the structure and operation of plasma doping systems is disclosed in U.S. Pat. No. 6,020,592, issued Feb. 1, 2000 to Liebert et al.; U.S. Pat. No. 6,182,604, issued Feb. 6, 2001 to Goeckner et al.; and U.S. Pat. No. 6,335,536, issued Jan. 1, 2002 to Goeckner et al., which are hereby incorporated herein by reference.

In operation, wafer 120 is positioned on platen 114. The controlled gas source 136 produces the desired pressure and gas flow rate within chamber 110. The pulse source 130 applies a series of pulses to wafer 120, causing formation of a plasma 140 in a plasma discharge region 148 between wafer 120 and anode 124. As known in the art, plasma 140 contains positive ions of the ionizable gas from gas source 136 and includes a plasma sheath in the vicinity, typically at the surface, of wafer 120. The electric field that is present between anode 124 and platen 114 during the pulse accelerates positive ions from plasma 140 across the plasma sheath toward platen 114. The accelerated ions are implanted into wafer 120 to form regions of dopant material. The pulse voltage is selected to implant the positive ions to a desired depth. The number of pulses and the pulse duration are selected to provide a desired dose of dopant material in wafer 120.

A short-time thermal processing step follows introduction of the dopant material to cause chemical bonding which results in formation of the charge carrier complexes. The parameters of the short-time thermal processing are selected to form the charge carrier complexes, while avoiding excessive time or temperature that can dissociate the complexes. Distinct combinations of species, doses, energies, anneal times and anneal temperatures exist that enhance the formation of the charge carrier complexes without dissociating them and, at the same time, provide damage-free or low damage layers that yield low leakage current devices. As used herein, "short-time thermal processing" refers to processes where the doped surface layer is heated to a desired temperature for a time of about 100 milliseconds (ms) or less and preferably for a time of about 10 milliseconds or less.

In one approach, short-time thermal processing is implemented as a flash RTP process. The flash RTP process involves: (1) rapid heating of the substrate to an intermediate temperature, and (2) while the substrate is heated to the intermediate temperature, very rapid heating of the doped surface layer to a final temperature. The final temperature is higher than the intermediate temperature, and the time duration of the second step is less than the time duration of the first step. By way of example, the first step of the flash RTP process may involve heating the substrate to an intermediate temperature in a range of about 500° C. to 800° C. for a time in a range of about 0.1 to 10 seconds. The second step may involve heating the doped surface layer to a final temperature in a range of about 1000° C. to 1410° C. and preferably a range of about 1050° C. to 1350° C., for a time in a range of about 0.1 to 100 milliseconds and preferably for a time in a range of about 0.1 to 10 milliseconds.

Figure 2:
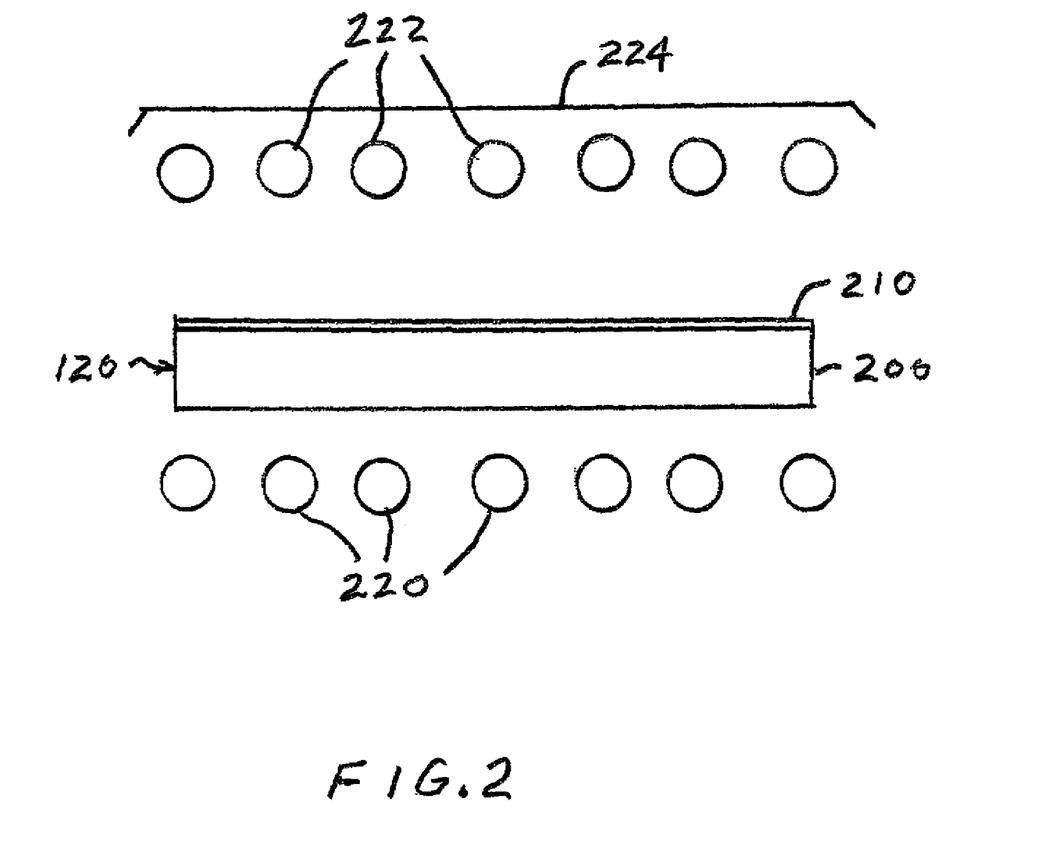
FIG. 2 is a schematic diagram of a flash rapid thermal processing system.

An example of apparatus for performing flash RTP is shown schematically in FIG. 2. Wafer 120 includes substrate 200 and thin surface layer 210 (not shown to scale). Tungsten halogen lamps 220 are positioned in proximity to a side of wafer 120 opposite from surface layer 210. Xenon flash lamps 222 and a reflector 224 are positioned in proximity to wafer 120 on the same side as surface layer 210. During the first step of the flash RTP process, lamps 220 are energized, and substrate 200 is heated by lamps 220 to an intermediate temperature. Then, when substrate 200 is at the intermediate temperature, flash lamps 222 are energized and an intense pulse of light is applied to surface layer 210, causing a rapid increase to a final temperature. The operation of flash lamps 222 may be on the order of a few milliseconds. The final temperature of surface layer 210 is sufficient to form charge carrier complexes as described above, but the time duration at the final temperature is sufficiently short to avoid disassociation of the charge carrier complexes. The flash RTP process is described, for example, by T. Ito et al. in "Flash Lamp Anneal Technology for Effectively Activating Ion Implanted Si", extended abstracts of the 2001 International Conference on Solid-State Devices and Materials, Tokyo, 2001, pages 182–183.

In another embodiment, short-time thermal processing is implemented by irradiating the doped surface layer with laser energy in a process referred to as "sub-melt laser processing", wherein the laser energy parameters are selected to form charge carrier complexes in the doped surface layer without melting of the surface layer or the substrate. The laser energy density used to irradiate the wafer is selected to heat the thin surface layer of the wafer rapidly, for example in less than about 10 microseconds, to a temperature that does not melt the silicon. The surface layer may be heated to a temperature in a range of about 1000° C. to 1410° C. and preferably in a range of about 1050° C. to 1350° C. The laser energy density may be in a range of about 0.5 to 0.58 joules per square centimeter at a wavelength of 308 nanometers and a pulse width of 20 nanoseconds. Additional details regarding submelt laser processing are disclosed in International Publication No. WO 01/71787, published Sep. 27, 2001, which is hereby incorporated by reference.

Figure 3:
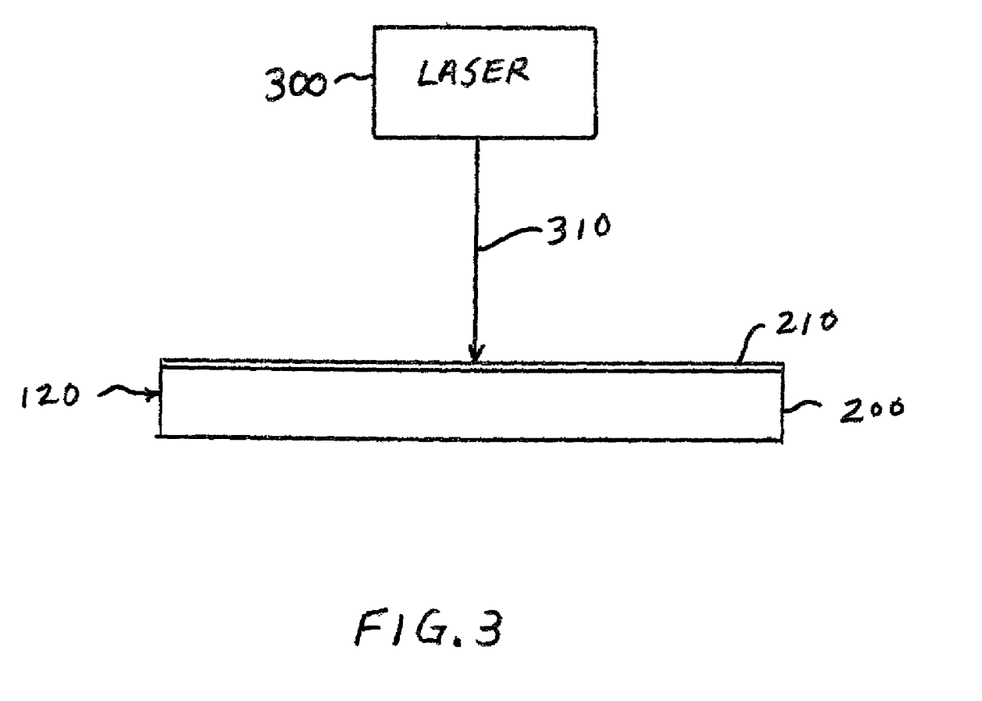
FIG. 3 is a schematic diagram of a sub-melt laser processing system.

A simplified schematic diagram of sub-melt laser processing apparatus is shown in FIG. 3. A laser 300 directs a laser beam at surface layer 210 of wafer 120. The laser beam 310 may be distributed over the surface of wafer 120 by scanning of laser beam 310, by mechanical translation of wafer 120 or by a combination of beam scanning and wafer translation. In one embodiment, laser beam 310 has a wavelength of 308 nanometers. One suitable system for performing sub-melt laser annealing is model LA-100, available from Verdant Technologies, which may be modified to perform sub-melt laser processing as described herein.

In a further embodiment, short-time thermal processing is implemented by performing RF (radio frequency) or microwave annealing of the doped surface layer. The RF or microwave annealing process involves: (1) rapid heating of the substrate to an intermediate temperature, and (2) while the substrate is heated to the intermediate temperature, very rapid heating of the doped surface layer to a final temperature with RF or microwave energy. By way of example, the first step of the RF or microwave annealing process may involve lamp heating of the substrate to an intermediate temperature in a range of about 500° C. to 800° C. for a time in a range of about 0.1 to 10 seconds. The second step may involve heating the doped surface layer with RF or microwave energy to a final temperature in a range of about 1000° C. to 1410° C. and preferably a range of about 1050° C. to 1350° C., for a time in a range of about 0.1 to 100 milliseconds and preferably for a time in a range of about 0.1 to 10 milliseconds.

Figure 4:
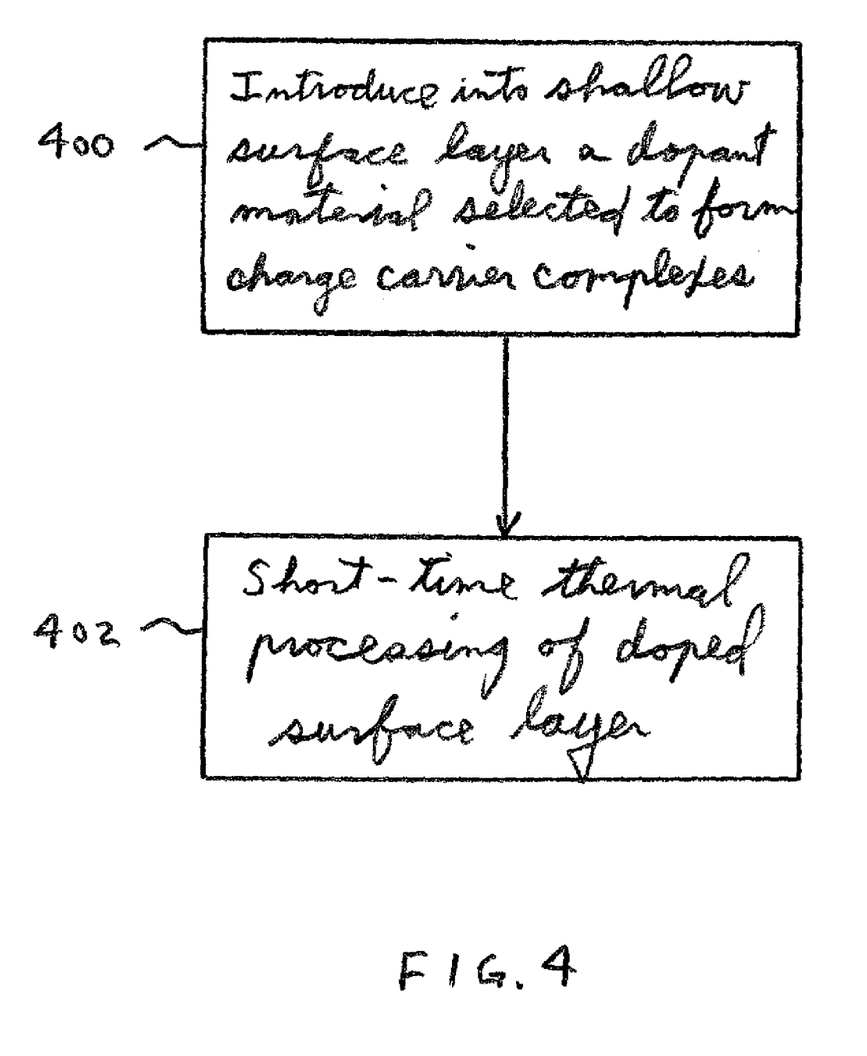
FIG. 4 is a flow diagram of a process for forming ultrashallow junctions in accordance with an embodiment of the invention.

A process in accordance with an embodiment of the invention is summarized in the flow diagram of FIG. 4. In step 400, a dopant material selected to form charge carrier complexes is introduced into a shallow surface layer of a semiconductor wafer. As described above, the dopant material may be introduced into the shallow surface layer using a beamline ion implanter, a plasma doping system or a variety of other deposition systems. In one embodiment, two dopant species which can chemically bond to form the charge carrier complexes are introduced into the shallow surface layer. In another embodiment, one dopant species which can chemically bond with the host material or with impurities/defects in the dopant material is introduced into the shallow surface layer.

In step 402, short-time thermal processing of the doped surface layer is performed. Examples of short-time thermal processing include flash RTP and sub-melt laser processing as described above. The parameters of the short-time thermal processing are selected to activate the dopant material to provide free charge carriers while avoiding disassociation of the charge carrier complexes.

Figure 5:
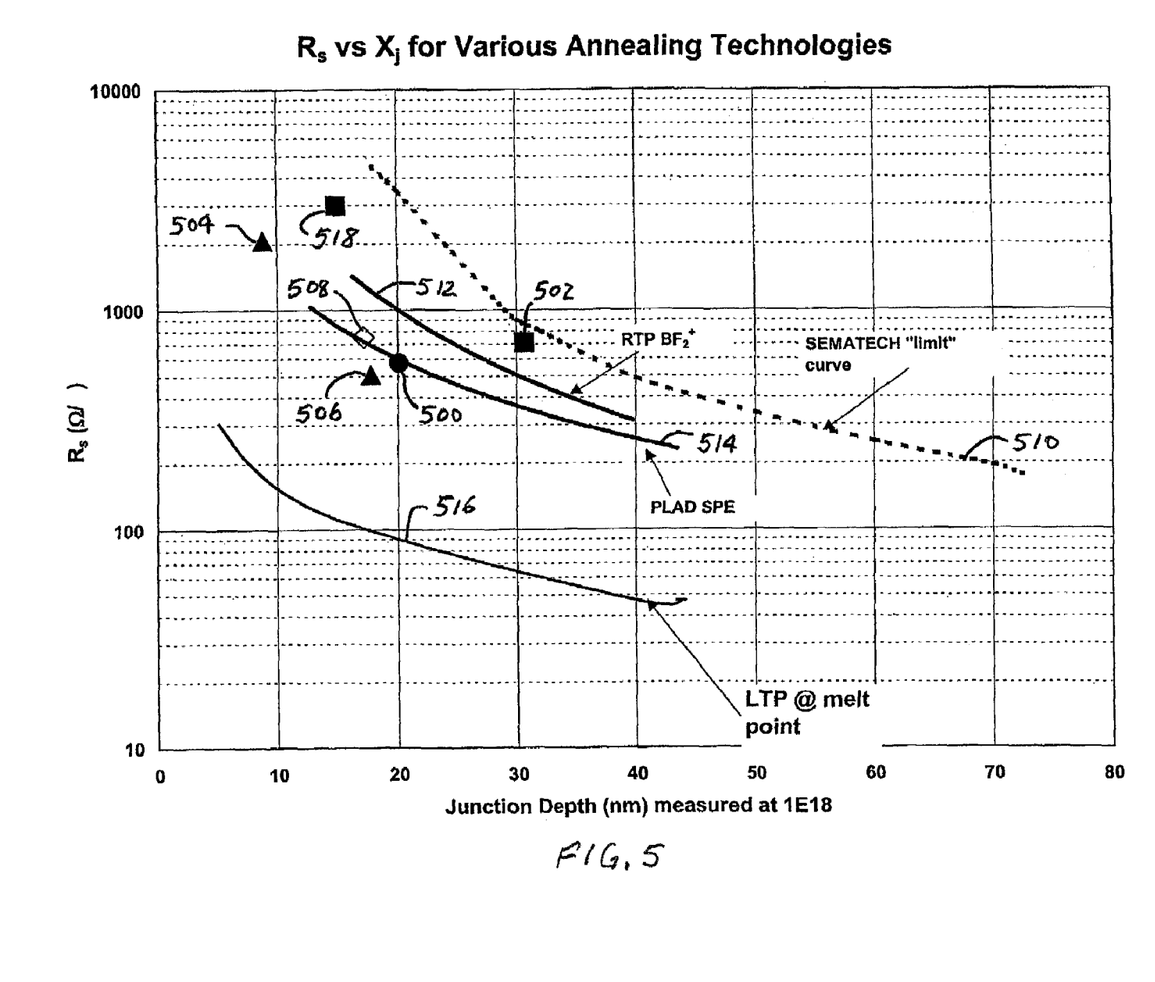
FIG. 5 is a graph of sheet resistance in ohms per square as a function of junction depth in nanometers, showing results of the process of the present invention and prior art results.
Figure 6:
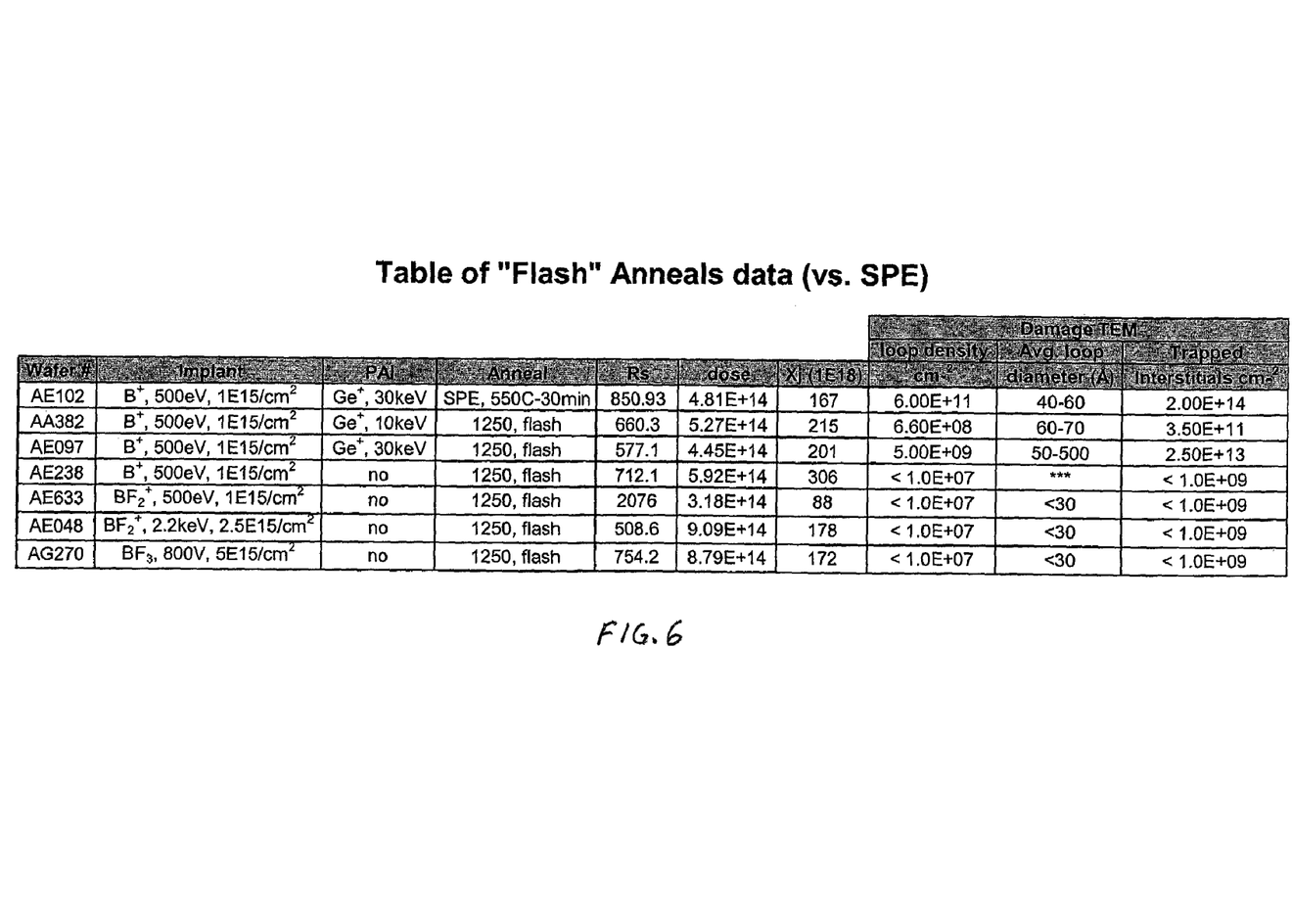
FIG. 6 is a table showing parameters of examples in accordance with the invention.

To demonstrate the existence of suitable combinations of implant species, energies, anneal times and temperatures to create low resistivity, ultrashallow damage-free layers, an experiment was performed. A series of wafers was doped according to the parameters shown in the table of FIG. 6. In FIG. 6, the first column gives a wafer reference number and the column labeled "implant" indicates implant conditions. All wafers except the last (AG270) were doped using a beamline implanter with the indicated species, energy and ion density. The last wafer (AG270) was doped in a plasma doping system as described above. The column labeled "PAI" indicates whether a germanium preamorphization implant was performed. The column labeled "anneal" gives the anneal conditions. As indicated, the first wafer in the table (AE102) was processed by solid-phase epitaxy (SPE) at 550° C. for 30 minutes. The remaining wafers were annealed by flash RTP as described above at a temperature of 1250° C. for about 1 millisecond. The column labeled "$R_s$" indicates measured sheet resistivity in ohms per square. The column labeled "dose" indicates the retained dose in atoms per cubic centimeter. The column labeled "$X_j$" indicates the junction depth measured at a dose of 1E18 atoms per cubic centimeter. The three columns labeled "damage TEM" represent wafer damage as measured by TEM (transmission electron microscopy). The measured values of sheet resistivity and junction depth are plotted in the graph of FIG. 5. In FIG. 5, point 500 corresponds to wafer AE097 in FIG. 6, point 502 corresponds to wafer AE238, point 504 corresponds to wafer AE633, point 506 corresponds to wafer AE048, and point 508 corresponds to wafer AE270.

The wafers were analyzed for sheet resistivity $R_s$ and junction depth $X_j$ by SIMS (secondary ion mass spectroscopy), damage by TEM and mobility and density of carriers by the Hall effect. The results in FIGS. 5 and 6 show that the sheet resistivity value for the 2.2 keV $BF_2$ wafer (AE048) is the most desirable on the graph of FIG. 5, with boron alone being the poorest and the germanium and boron being the second best. A high rating is given to a wafer having low values of both sheet resistivity $R_s$ and junction depth $X_j$. In addition to having the best sheet resistivity and junction depth values, the $BF_2$ wafer was damage free as determined by TEM. The plasma doped wafer (AG270) and the 500 eV $BF_2$ wafer (AE633) were also damage free. The boron implanted wafer and the germanium with boron implanted wafer had relatively minor damage remaining. The germanium with boron wafer, however, was much improved as compared to a standard RTP or SPE anneal of the same implant conditions. To compare these results to prior art techniques, prior art results are shown in FIG. 5. In FIG. 5, curve 510 represents a prior art Sematech RTP limit, curve 512 represents a prior art $BF_2$ RTP result, curve 514 represents a prior art PLAD SPE result, curve 516 represents a prior art laser melt result, and point 518 represents a result cited in the above-referenced article by T. Ito et al. In the PLAD SPE case, the doped layers were damaged. The laser melt case is considered undesirable from a process integration viewpoint. Other than the laser melt technique, the 2.2 keV $BF_2$ wafer is the most desirable with respect to sheet resistivity and junction depth and is damage free. In addition, all of the flash anneal wafers did not demonstrate diffusion from the as-implanted profile and, therefore, maintain lateral abruptness.

Having thus described at least one illustrative embodiment of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed is:

1. A method for forming an ultra-shallow junction in a semiconductor wafer, comprising:
    introducing into a shallow surface layer of a semiconductor wafer a dopant material
    that is selected to form charge carrier complexes which produce at least two charge carriers per complex; and
    short-time thermal processing of the doped surface layer using predetermined parameters to cause chemical bonding by rapid heating the substrate of the semiconductor wafer to an intermediate temperature by a first heat source in proximity to a side of the semiconductor wafer opposite from the shallow surface layer and flash heating the doped surface layer to a final temperature that is higher than the intermediate temperature by a second heat source that is positioned in proximity to the semiconductor wafer on the same side as the shallow surface layer to form said charge carrier complexes including bound exciton complexes while preventing dissociation of said charge carrier complexes.

2. A method as defined in claim 1, wherein the step of short-time thermal processing comprises flash rapid thermal processing of the doped surface layer.

3. A method as defined in claim 1, wherein the step of short-time thermal processing comprises sub-melt laser processing of the doped surface layer.

4. A method as defined in claim 1, wherein the step of short-time thermal processing of the doped surface layer comprises heating the doped surface layer to a desired temperature for a time of about 100 milliseconds or less.

5. A method as defined in claim 1, wherein the step of short-time thermal processing of the doped surface layer comprises heating the doped surface layer to a desired temperature for a time of about 10 milliseconds or less.

6. A method as defined in claim 1, wherein the step of short-time thermal processing of the doped surface layer comprises thermal processing at a temperature in a range of about 1000° C. to 1410° C.

7. A method as defined in claim 1, wherein the step of short-time thermal processing of the doped surface layer comprises thermal processing at a temperature in a range of about 1050° C. to 1350° C.

8. A method as defined in claim 1, wherein the dopant material comprises two species selected to form said charge carrier complexes.

9. A method as defined in claim 1, wherein the dopant material comprises a compound containing two species selected to form said charge carrier complexes.

10. A method as defined in claim 1, wherein the first heat source comprises tungsten halogen lamps and the second heat source comprises xenon flash lamps and a reflector.

11. A method as defined in claim 1, wherein the dopant material is selected to chemically bond with atoms of the semiconductor wafer to form the charge carrier complexes.

12. A method as defined in claim 1, wherein the dopant material is selected from the group consisting of B—F, B—Ge, B—Si, P—F, P—Ge, P—Si, As—F, As—Ge and As—Si.

13. A method as defined in claim 1, wherein the step of introducing a dopant material into a shallow surface layer comprises ion implantation of the dopant material.

14. A method as defined in claim 1, wherein the step of introducing a dopant material into a shallow surface layer comprises plasma doping of the dopant material.

15. A method as defined in claim 1, wherein said dopant material is selected from the group consisting of boron, boron and germanium, $BF_2$ and $BF_3$.

16. A method as defined in claim 1, wherein the step of short-time thermal processing comprises RF or microwave annealing of the doped surface layer.

17. A method for forming an ultrashallow junction in a semiconductor wafer, comprising:
introducing into a shallow surface layer of a semiconductor wafer a dopant material selected from the group consisting of boron, boron and germanium, $BF_2$ and $BF_3$; and
flash rapid thermal processing of the doped surface layer using predetermined parameters to cause chemical bonding to form charge carrier complexes which produce at least two charge carriers per complex while preventing dissociation of the charge carrier complexes by rapid heating the substrate of the semiconductor wafer to an intermediate temperature for a first predetermined time by a first heat source in proximity to a side of the semiconductor wafer opposite from the shallow surface layer and flash heating of the doped surface layer to a final temperature that is higher than the intermediate temperature for a second predetermined time less than the first predetermined time by a second heat source that is positioned in proximity to the semiconductor wafer on the same side as the shallow surface layer.

18. A method as defined in claim 17, wherein the step of flash rapid thermal processing of the doped surface layer comprises rapid heating of the substrate to the intermediate temperature in a range of about 500° C. to 800° C. for the first predetermined time in a range of about 0.1 to 10 seconds.

19. A method as defined in claim 17, wherein the step of flash rapid thermal processing of the doped surface layer comprises heating the doped surface layer to a desired temperature for a time of about 100 milliseconds or less.

20. A method as defined in claim 17, wherein the step of flash rapid thermal processing of the doped surface layer comprises heating the doped surface layer to a desired temperature for a time of about 10 milliseconds or less.

21. A method as defined in claim 17, wherein the step of flash rapid thermal processing of the doped surface layer comprises thermal processing at the final temperature in a range of about 1000° C. to 1410° C.

22. A method as defined in claim 17, wherein the step of flash rapid thermal processing of the doped surface layer comprises thermal processing at the final temperature in a range of about 1050° C. to 1350° C.

23. A method as defined in claim 17, wherein the step of introducing a dopant material comprises ion implantation of the dopant material.

24. A method as defined in claim 17, wherein the step of introducing a dopant material comprises plasma doping of the dopant material.

25. A method as defined in claim 17, wherein the first heat source comprises tungsten halogen lamps and the second heat source comprises xenon flash lamps.

* * * * *